(12) United States Patent
Neal et al.

(10) Patent No.: US 7,111,270 B2
(45) Date of Patent: Sep. 19, 2006

(54) METHOD AND APPARATUS TO ADAPTIVELY VALIDATE A PHYSICAL NET ROUTING TOPOLOGY OF A SUBSTRATE DESIGN

(75) Inventors: Brett A. Neal, Gilbert, AZ (US); Neal G. Meyer, Chandler, AZ (US); Andrew J. McRonald, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 96 days.

(21) Appl. No.: 10/376,052

(22) Filed: Feb. 26, 2003

(65) Prior Publication Data

US 2004/0168138 A1 Aug. 26, 2004

(51) Int. Cl.
*G06F 17/50* (2006.01)
*G06F 9/45* (2006.01)

(52) U.S. Cl. .................. 716/12; 716/4; 716/7; 716/8; 716/18

(58) Field of Classification Search .............. 716/1–13, 716/18
See application file for complete search history.

(56) References Cited

U.S. PATENT DOCUMENTS

| 5,455,775 | A | * | 10/1995 | Huber et al. ............. 716/7 |
| 5,528,508 | A | * | 6/1996 | Russell et al. ........... 716/8 |
| 5,541,849 | A | * | 7/1996 | Rostoker et al. ......... 716/18 |
| 5,724,251 | A | | 3/1998 | Heavlin |
| 5,933,356 | A | * | 8/1999 | Rostoker et al. ......... 703/15 |
| 6,009,251 | A | * | 12/1999 | Ho et al. .................. 716/5 |
| 6,560,758 | B1 | * | 5/2003 | Jain ........................ 716/7 |
| 6,581,191 | B1 | * | 6/2003 | Schubert et al. ......... 716/4 |

* cited by examiner

*Primary Examiner*—Leigh M. Garbowski
(74) *Attorney, Agent, or Firm*—Schwegman, Lundberg, Woessner & Kluth, P.A.

(57) ABSTRACT

A method and apparatus to adaptively validate a physical net routing topology of a substrate design to a target topology of the substrate design. A tree data structure is generated by mapping physical net routing topology objects to tree data structure objects the tree data structure representing the substrate design. The tree data structure is then compressed to form a compressed tree data structure. The compressed tree data structure is validated by comparing the target topology with the compressed tree data structure to determine if the target topology is electrically equivalent to the compressed tree data structure. One or more branches of the validated tree data structure is named, and the validated tree data structure is partitioned and saved.

28 Claims, 6 Drawing Sheets

```
405~NODE  = J6L1                    ~400
410~NEXT  = TL-1
420~NODE  = R6L4.1
430~NEXT  = TL-2
440~FORK  = START
        450~NEXT = TL-3
        460~NODE - U3M1.1
470~FORK  = END
480~NEXT  = TL-4
490~NODE  = U6M1.11
```

*Fig. 4*

```
405~NODE  = J6L1
410~NEXT  = TL-1

411~FORK  = START
        412~SERIES = R6L4.1
        413~NEXT   = TL-5
        414~NODE   = U7M2.3
415~FORK  = END

430~NEXT  = TL-2
440~FORK  = START
        450~NEXT = TL-3
        460~NODE = U3M1.1
470~FORK  = END
480~NEXT  = TL-4
490~NODE  = U6M1.11
```

METHOD AND APPARATUS TO ADAPTIVELY VALIDATE A PHYSICAL NET ROUTING TOPOLOGY OF A SUBSTRATE DESIGN

BACKGROUND

1. Field of the Invention

The present invention is related to the field of substrate design. In particular, the present invention is related to a method and apparatus to adaptively validate a physical net routing topology to a target topology of a substrate design.

2. Description of the Related Art

A substrate design is a physical layout of components on a circuit board and illustrates e.g., junctions, nodes, metal fills, component types and shapes, specific distances between nodes, etch endpoints, interconnects, etc. as they physically appear on the circuit board. Designers frequently use computers to design substrates from a given target topology. A physical net routing topology comprises a description of the nodes, interconnects and components of the substrate design. The physical net routing topology may be stored in a database and may be used to verify if a given target topology has been followed in the substrate design.

A target topology, typically provided by an engineer, is a logical description of the circuit that is used e.g., by a designer to design the substrate.

In order to verify that the given target topology is complied with in the substrate design, the target topology is compared with the physical net routing topology. Conventional checking algorithms that compare the given target topology with the physical net routing topology of the substrate design are inflexible and may not allow a comparison between the two topologies (i.e., the target topology and the physical net routing topology) if the two topologies differ, even though the two topologies are electrically equivalent. For example, if a test-point is added in a substrate design and the added test-point does not affect the electrical equivalence between the target topology and the physical net routing topology, conventional checking algorithms fail.

BRIEF SUMMARY OF THE DRAWINGS

Example embodiments of the present invention are illustrated in the accompanying drawings. The accompanying drawings, however, do not limit the scope of the present invention. Similar references in the drawings indicate similar elements.

DETAILED DESCRIPTION

Described is a method and apparatus to adaptively validate a physical net routing topology of a substrate design to a target topology of the substrate design. In one embodiment of the invention, a tree data structure is generated by mapping physical net routing topology objects to tree data structure objects said tree data structure representing the substrate design. The tree data structure is then compressed to form a compressed tree data structure. The compressed tree data structure is then validated by comparing the target topology with the compressed tree data structure to determine if the target topology is electrically equivalent to the compressed tree data structure. One or more branches of the validated tree data structure is named, and the validated tree data structure is partitioned and saved.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art to effect such feature, structure, or characteristic in connection with other embodiments whether or not explicitly described. Parts of the description are presented using terminology commonly employed by those of ordinary skill in the art to convey the substance of their work to others of ordinary skill in the art.

In the following description and claims, the terms "coupled" and "connected", along with derivatives such as "communicatively coupled" may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct physical contact with each other, but still co-operate or interact with each other.

Figure 1:
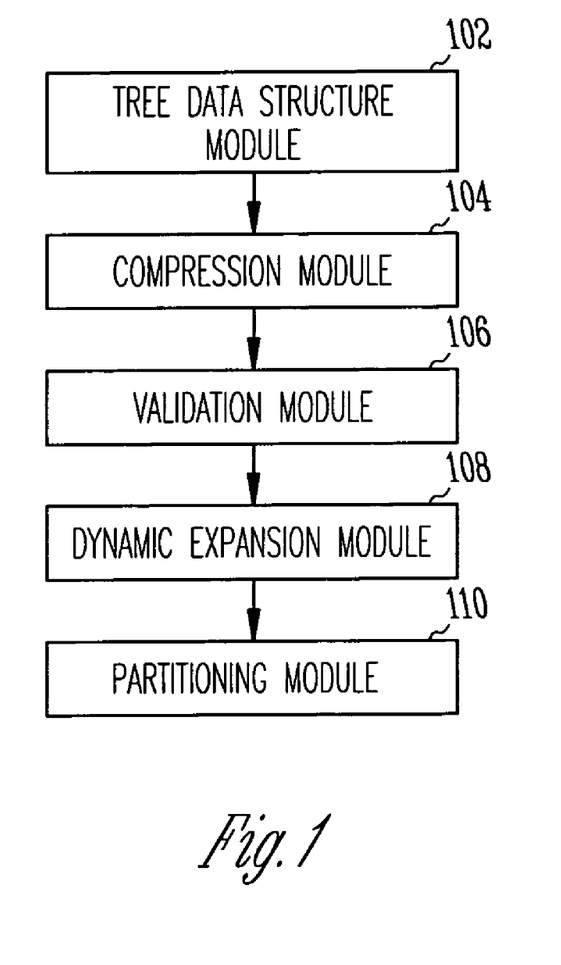
FIG. 1 illustrates a block diagram of a method to adaptively validate a physical net routing topology to a target topology of a substrate design according to one embodiment of the invention.

FIG. 1 illustrates a block diagram of a method to adaptively validate a physical net routing topology to a target topology of a substrate design according to one embodiment of the invention. As illustrated in FIG. 1, to adaptively validate a physical net routing topology of a substrate design to a target topology, a tree data structure module 102 initially generates a tree data structure. The tree data structure is generated by mapping physical net routing topology objects of the substrate design, stored in the CAD database to tree objects of the tree data structure. The tree data structure that is generated represents the substrate design. In one embodiment of the invention, the tree data structure comprises at least nodes and branches. Nodes in the tree data structure represent component pins, etch junctions (Ts), dead-end routing etches, and shapes found in the substrate design, and branches in the tree data structure represent at least etch and vias that connect a pair of nodes in the substrate design.

Tree data structure module 102 is communicatively coupled with compression module 104. Compression module 104 compresses the tree data structure to form a compressed tree data structure. During compression of the tree data structure some branches may be added or removed or merged e.g., branches that exist within a pin pad may be removed, test stubs may be removed, dead-end branches corresponding to dummy vias may also be removed, etc. Compression of the tree data structure may eliminate non-essential physical net routing topology objects comprising a branch, or even an entire branch.

Compression module 104 is communicatively coupled with validation module 106. Validation module 106 compares the compressed tree data structure to the target topology to determine whether an electrical equivalence exists between the compressed tree data structure and the target topology. Validation module 106 parses the target topology to match items in the compressed tree data structure with objects specified in the target topology. Where there is an electrical equivalence between the compressed tree data structure and the target topology, the compressed tree data structure may be modified to match the target topology. For example, a node or interconnect in a branch in the compressed tree data structure may be found in a branch in a level below where it is expected. In this case, the object is marked as a pin-stub and the compressed tree data structure modified to match the target topology.

Validation module 106 is communicatively coupled with dynamic expansion module 108. Dynamic expansion module 108 expands the validated tree data structure depending whether a traversal through a discrete component pin has been opted for by e.g., a user. If dynamic expansion has been opted (i.e., a traversal through a discrete component pin has been opted), one or more additional networks in the substrate design are included in the validated tree data structure.

As illustrated in FIG. 1, dynamic expansion module is communicatively coupled with partitioning module 110. In one embodiment of the invention, the partitioning module 110 partitions sections of the validated tree data structure. Sections of the validated tree data structure may be uniquely named or labeled by partitioning module 110 and saved for future reference. Thus, the user may easily obtain information about a particular section of the validated tree data structure e.g. trace length, via count, trace width etc.

Figure 2:
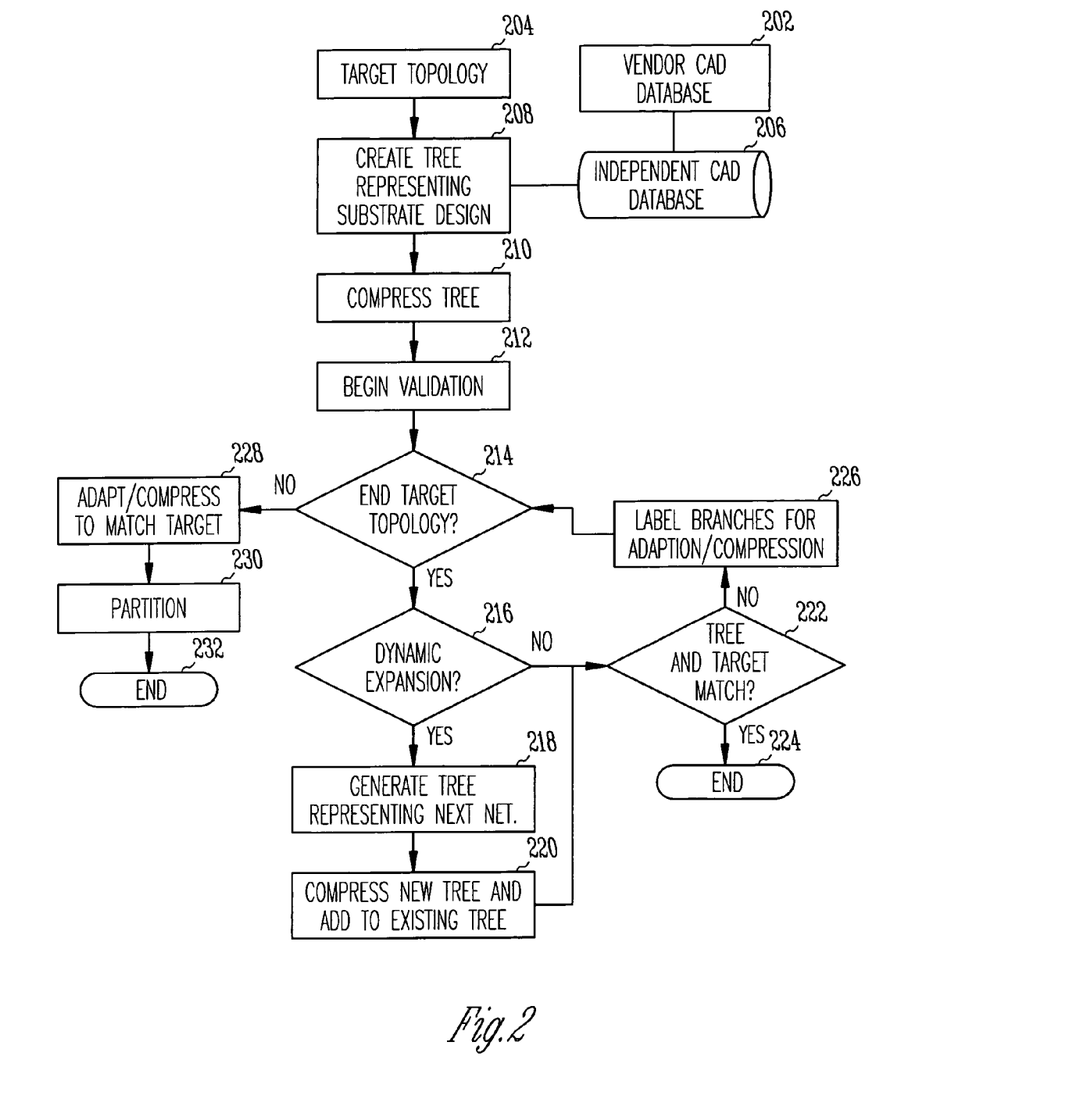
FIG. 2 illustrates a flowchart to adaptively validate a physical net routing topology to a target topology of a substrate design according to one embodiment of the invention.

FIG. 2 illustrates a flowchart to adaptively validate a physical net routing topology to a target topology of a substrate design according to one embodiment of the invention. As illustrated in FIG. 2, at 202, a vendor CAD database is converted to an independent CAD database 206. The conversion of the vendor CAD database 202 to the independent CAD database 206 is necessary so that a physical net routing topology stored in the vendor CAD database may be adaptively validated against a target topology regardless of the specific nuances of a vendor CAD program that generates the physical net topology. In one embodiment of the invention, plug-in modules corresponding to a particular vendor's CAD database may be used to effect the conversion from the vendor's CAD database 202 to the independent CAD database 206.

In one embodiment of the invention, to create the tree data structure, the tree data structure module 102 searches for a unique starting component pin as defined in the target topology 204 to begin the generation of the tree data structure. In one embodiment of the invention, the unique starting component pin may be input into the tree data structure module 102 in real-time by e.g., a user. Thus, in one embodiment of the invention, both the target topology 204 and the independent CAD database 206 is accessible to the tree data structure module 102. The unique starting component pin from target topology 204 may serve as, for example, a root, in the generation of the tree data structure. Once the unique starting component pin is located by tree data structure module 102 in the independent CAD database, etches and vias in the independent CAD database coupled to the unique starting component pin are added to e.g., branch objects to form a branch of the tree data structure. The process of adding branch objects to the tree data structure continues until a node is located. In one embodiment of the invention, if the tree data structure module 102 locates a pin as part of a discrete component (e.g., a resistor or capacitor) when traversing a branch of the physical net topology in the independent CAD database, the pin is not automatically traversed. However, the pin may be marked for potential expansion at a later time. (Please see 216 below for expansion of the tree data structure). Thus, the tree data structure generated at 208 corresponds with the substrate design found in the vendor CAD database 206.

At 210, the tree data structure generated 208 is compressed by e.g., compression module 104 to represent how one having ordinary skill in the art would logically understand the tree connectivity. For example, branches that exist within a pin pad may be removed by compression module 104. So also, test stubs and other devices may be removed by compression module 104. Additionally, dead-end branches for dummy vias that do not lead to additional routing paths are removed from the tree data structure to form a compressed tree data structure at 210.

At 212 the compressed tree data structure is validated by e.g., validation module 106. During validation of the compressed tree data structure, validation module 106 may verify that the target topology and compressed tree data structure are electrically equivalent. Validation module 106 parses the target topology 204 and attempts to match items in the target topology with objects in the compressed tree data structure. Thus, in one embodiment of the invention, validation module 106 parses the target topology 204 line by line attempting to match items in the target topology with objects in the compressed tree data structure. If the validation module 106 cannot match an item (e.g., an object) in the target topology with an object in the compressed tree data structure at nodes of the same level, the validation module searches for the object in the compressed tree data structure at a level below e.g., at child nodes. Thus, if no match is found at the parent nodes, the validation module 106 will search for the object at child nodes. Objects found in the child nodes are marked e.g., as pin-stub deviations and are handled as described later in 228.

At 214, validation module 106 determines whether there exists another line of code in the target topology. If at 215 there is another line of code in the target topology, validation module 106 determines whether the line of code in the target topology calls for dynamically expanding the compressed tree data structure (e.g., by using the SERIES key word described with respect to FIG. 5. If the dynamically expansion option is elected, at 218, dynamic expansion module 108 dynamically expands the validated tree data structure and includes in the validated tree data structure a tree representing the next network (i.e., the network that exists on the other end of e.g., a discrete component pin). In order to dynamically expand the validated tree data structure, dynamic expansion module 108 on reaching the discrete component pin (e.g., a pin of a resistor, capacitor, inductor etc.) traverses through the discrete component pin. At 218, dynamic expansion module 108 creates a new tree data structure for the new physical net routing topology by adding objects to the new tree data structure as explained above. At 220, the new tree data structure is compressed as described above and is added to the validated tree data structure to form an expanded tree data structure. One having ordinary skill in the art will appreciate that after creating the expanded tree data structure at 216 program flow may branch to the compression process described at 210. Thus, the process continues until the end of the code comprising the target topology is reached.

In one embodiment of the invention, if at 216 a decision is made by e.g., dynamic expansion module 108 not to expand the compressed tree data structure, the validation module 106 determines, at 222, whether the compressed tree data structure matches the target topology 204. If the compressed tree data structure does not match the target topology 204, a validation error is generated and the process ends 224.

However, if at 222, the compressed tree data structure and/or the expanded tree data structure match the target topology, at 226, partitioning module 110 may label sections of branches of the compressed tree data structure and/or the expanded tree data structure for adaptation and compression. In one embodiment of the invention, the labeling of branches of the compressed tree data structure may occur at 214 as soon as validation module 106 determines that there exists another line of code in the target topology. After labeling sections of branches for adaptation and compression if a determination is made at 214 by e.g., validation module 106 that the end of the code comprising the target topology is reached, sections of the branches of the resulting tree data structure are adapted and compressed by e.g., partitioning module 110 to match the target topology.

As part of the adaption and compression process branches that were marked as pin-stub deviations at 212 above are removed at 228 as follows. Branches marked as pin-stub deviations are added to both the parent branch of the fork node that owns the pin-stub as well as to the child branch of the fork. By adding pin-stub deviations to both the parent branch and the child branch the true etch length for the node-to-node connection of the resulting tree data structure is obtained. Thus, the fork is removed from the branch and is replaced by a node at the end of the pin-stub. After adaption and compression as described above, the resulting tree data structure matches the target topology. At 230, partitioning module 110 may save the individual branches of the resulting tree data structure with the corresponding labels assigned to the branches at 226. After partitioning module 110 saves the individual branches of the resulting tree data structure with the corresponding labels, the process ends at 232.

Figure 3:
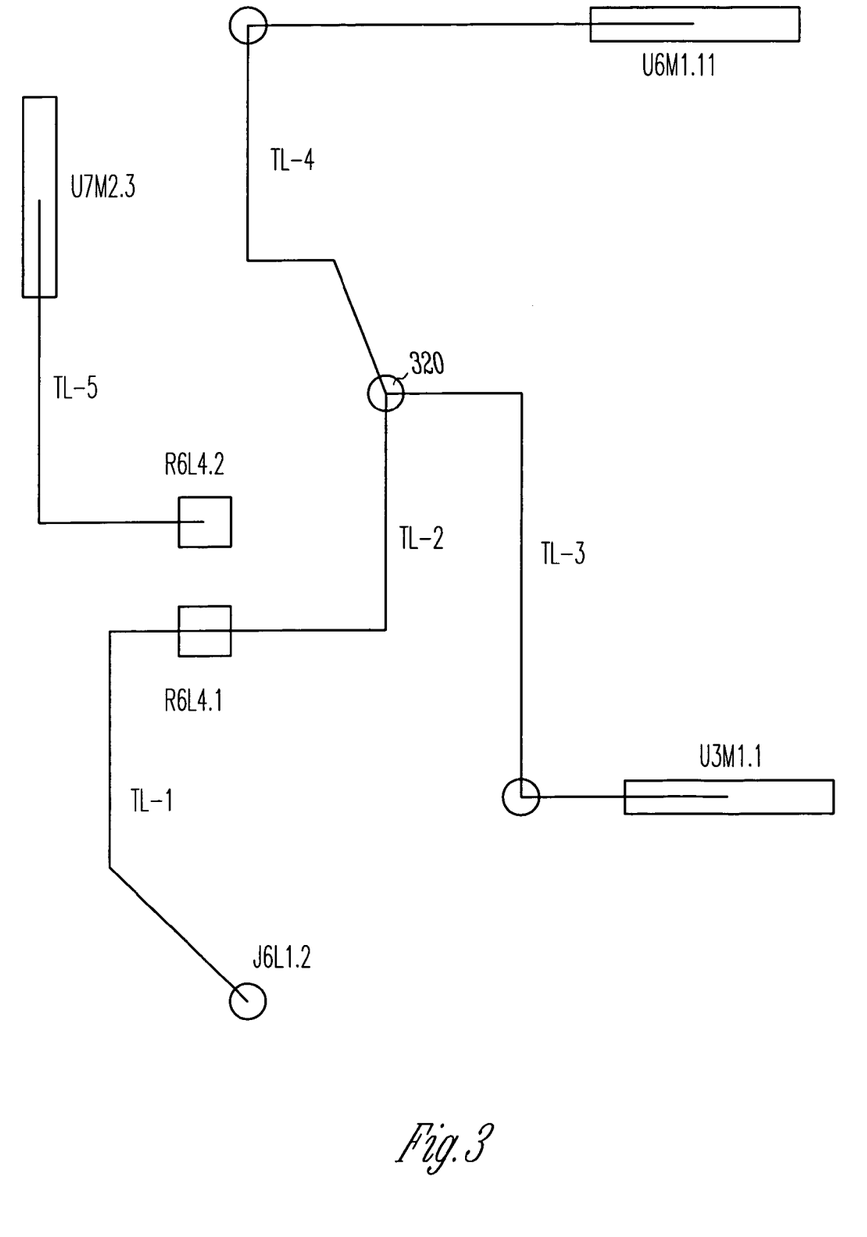
FIG. 3 illustrates a wiring diagram of a substrate design according to one embodiment of the invention.

FIG. 3 illustrates a wiring diagram of a substrate according to one embodiment of the invention. As illustrated in FIG. 3, substrate design 300 comprises circuit component J6L1.2 e.g., a pin of an integrated circuit coupled to R6L4.1 e.g., a resistor lead, via trace line TL-1. Circuit component R6L4.1 is coupled to a fork 320 via trace line TL-2. Fork 320 is coupled to circuit component U6M1.11 e.g., a pin of a second integrated circuit via trace line TL-4. Fork 320 is also coupled to circuit component U3M1.1 e.g., a pin of a third integrated circuit via trace line TL-3. Circuit component R6L4.2 is coupled to circuit component U7M2.3 e.g., a pin of a fourth integrated circuit via trace line TL-5.

Figure 4:
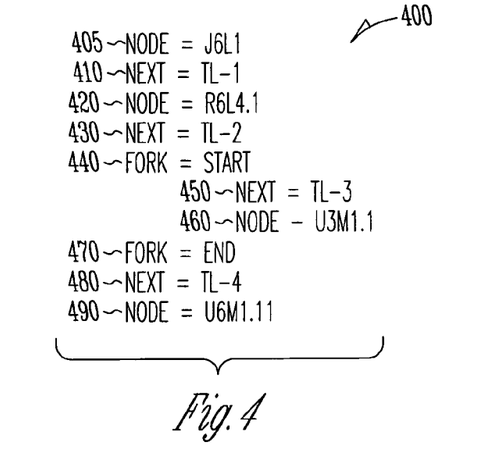
FIG. 4 illustrates a target topology from which a designer may specify for the substrate design of FIG. 3 according to one embodiment of the invention.

FIG. 4 illustrates a target topology from which a designer may design the substrate design of FIG. 3 according to one embodiment of the invention. As illustrated in FIG. 4, target topology 400 comprises code lines 405–490 and includes software keywords. The keyword NODE in code line 405 indicates a node, thus NODE=J6L1 indicates a NODE at component pin J6L1. Examples of nodes are component pins, shapes, and the endpoints of a dead end etch. The keyword NEXT in code line 410 indicates a trace line or an interconnect is coupled to the node. Thus, Next=TL-1 at code line 410 indicates that trace line TL-1 is coupled to NODE J6L.1. At 420, NODE=R6L4.1 indicates that a node exists at R6L4.1, and is coupled to TL-1. At 430, NEXT=TL-2 indicates that trace line TL-2 is coupled to the NODE R6L4.1. At 440, FORK=START indicates a FORK at the end of TL-2. In particular, it indicates that a connection point of three or more etch lines or three or more nodes is coupled to the node at the beginning of the fork. At 450, NEXT=TL-3 indicates that trace line TL-3 is coupled to the start of the fork, and NODE=U3M1.1 indicates that the end of trace line TL-3 is coupled to node U3M1.1. At 470, FORK=end indicates the end of a branch in the FORK. At 480, NEXT=TL-4 indicates trace line 4 is coupled to the start of the fork . . . and NODE=U6M1.11, at code line 490, indicates that node U6M1.11 is coupled to the end of trace line TL-4.

Figure 5:
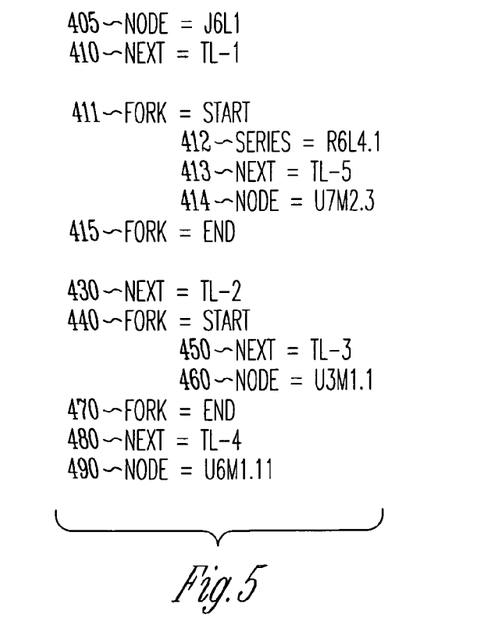
FIG. 5 illustrates the target topology of FIG. 4 wherein a discrete component is traversed, expanding the network, according to one embodiment of the invention.

FIG. 5 illustrates the target topology of FIG. 4 wherein a discrete component is traversed, expanding the network, according to one embodiment of the invention. As illustrated in FIG. 5, at code lines 411–415 the discrete component R6L4.1 is traversed and is therefore part of the adaptive validation process. Thus, FORK=START at code line 411 indicates the start of the traversal. Keyword SERIES at code line 412 indicates the traversal of the discrete component R6L4.1 and illustrates the beginning of dynamic expansion. Code line 413, Next=TL-5 indicates that trace line TL-5 couples NODE R6L4.1 to U7M2.3. Code line 414 NODE=U7M2.3 indicates that component U7M2.3 terminates in a node that is coupled to the end of trace line TL-5. Code line 415 FORK=END indicates the end of the fork. Thus, the network including component U7M2.3 is added to the network under consideration.

Figure 6:
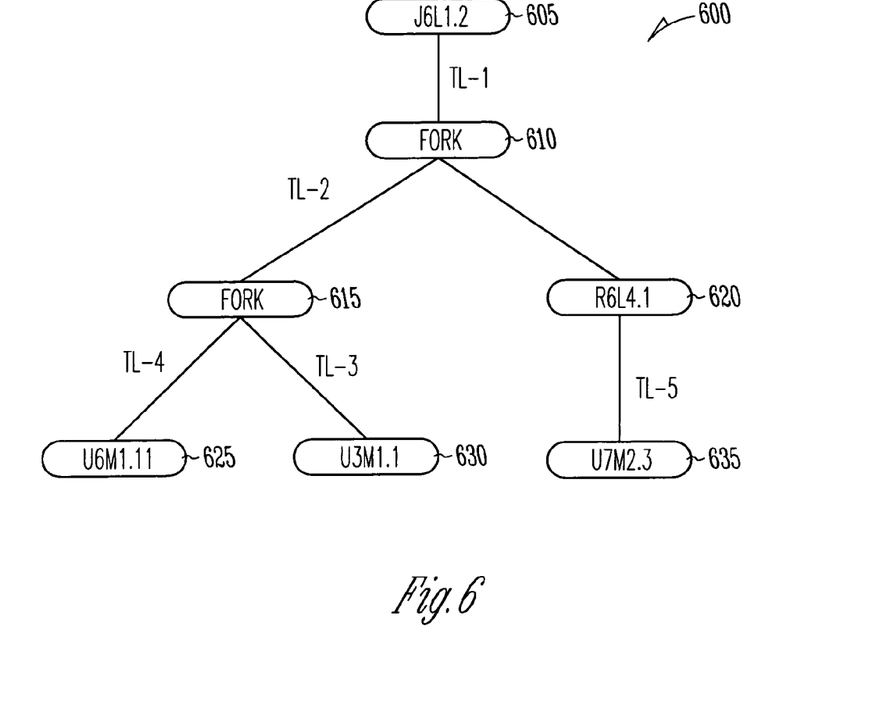
FIG. 6 illustrates the tree data structure representing the substrate design of FIG. 5 according to one embodiment of the invention.

FIG. 6 illustrates the tree data structure representing the substrate design of FIG. 5 according to one embodiment of the invention. As illustrated in FIG. 6, tree data structure 500 is constructed by the target topology of FIG. 5 defining a unique starting component pin i.e., J6L1.2. After obtaining the unique starting component pin from the independent CAD database the tree data structure is constructed as described with respect to FIG. 2. Therefore, the fork at 610 illustrates the discrete component R6L4.1, with a trace length of TL-1 between J6L1.2 and the discrete component pin R6L4.1. Node 620 R6L4.1 indicates the traversal of the discrete component with trace length TL-5 coupled to discrete component pin R6L4.1. Trace TL-5 ends in node 635 i.e., U6M2.3. Trace line TL-2 couples fork 610 (i.e., R6L4.1) to via 320 of FIG. 3. Thus via 320 is indicated by fork 615 with TL-4 terminating in node 625 (i.e., U6M1.11) and TL3 terminating in node 630 (i.e., U3M1.1), with both TL-3 and TL-4 having a common point at fork 615 (i.e., via 320).

Figure 7:
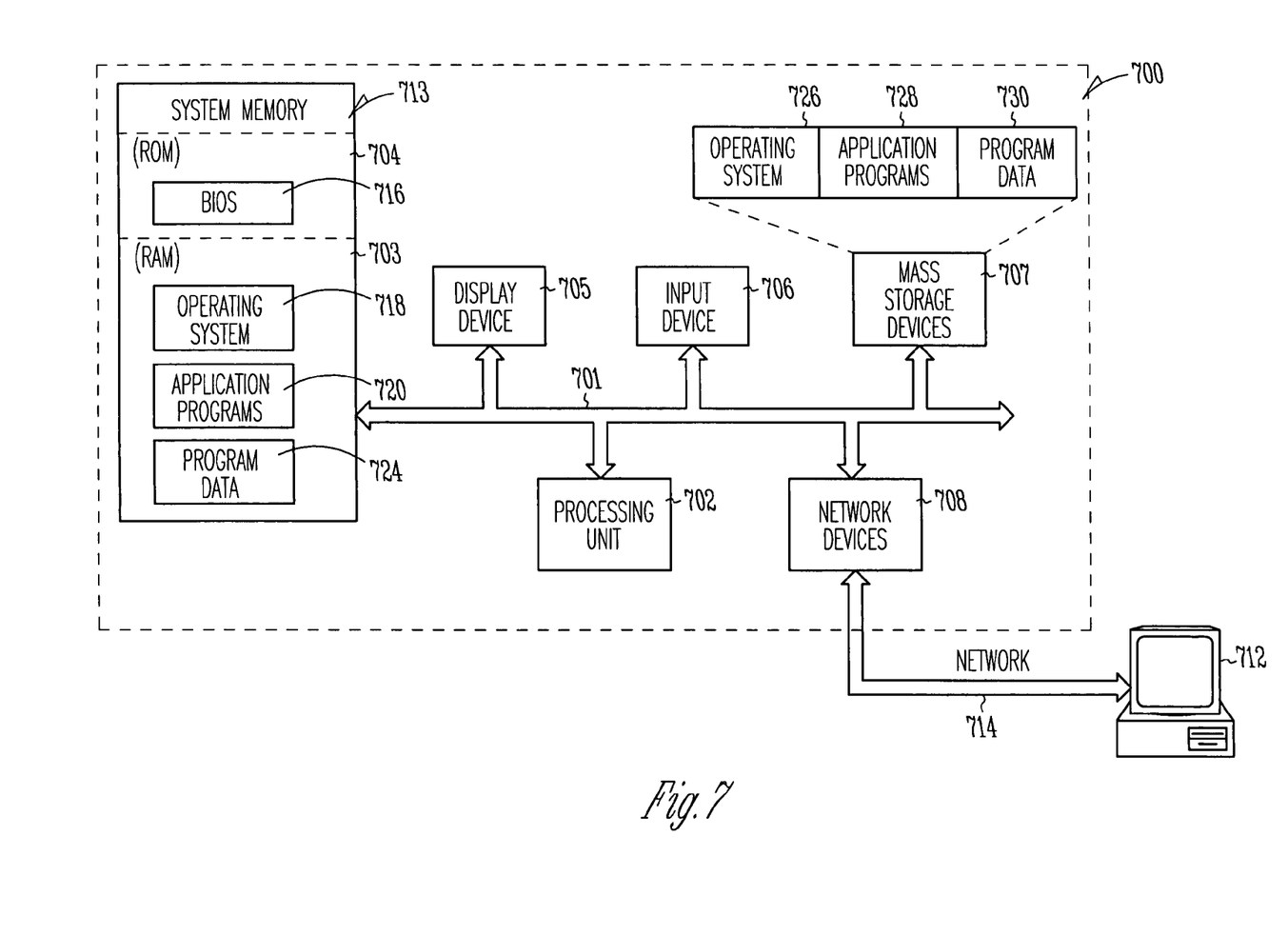
FIG. 7 illustrates a block diagram of an apparatus to adaptively validate a physical net routing topology to a target topology of a substrate design according to one embodiment of the invention

FIG. 7 illustrates a block diagram of an apparatus to adaptively validate a physical net routing topology to a target topology of a substrate design according to one embodiment of the invention. In general, the computer system 700 may comprise a processing unit 702 communicatively coupled through a bus 701 to system memory 713, mass storage devices 707, Input devices 706, display device 705 and network devices 708.

Bus 701 may be any of several types of bus structures including a memory bus, a peripheral bus, and a local bus using any of a variety of bus architectures. System memory 713 comprises a read only memory (ROM) 704 and random access memory (RAM) 703. ROM 704 comprises basic input output system (BIOS) 716. BIOS 716 contain the basic routines, e.g., start up routines, that facilitate the transfer of information between elements within computer system 700. RAM 703 includes cache memory and comprises operating system 718, application programs 720, and program data 724. Application programs 720 include the program code for implementing the method to adaptively validate a physical net routing topology of a substrate design described with respect to FIGS. 1–6 above. Program data 724 may include data generated by application programs 720. Mass storage device 707 represents a persistent data storage device, such as a floppy disk drive, fixed disk drive (e.g., magnetic, optical, magneto-optical, or the like), or streaming tape drive. Mass storage device 707 may store application programs 728, operating system 726 for computer system 700, and program data 730. Application programs 728 and program data 730 stored on mass storage devices 707 may include the application programs 720 and program data 724 stored in RAM 703. One embodiment of the invention may be stored entirely as a software product on mass storage device 707. Embodiments of the invention may be represented as a software product stored on a machine-readable medium (also referred to as a computer-accessible medium, a machine-accessible medium, or a processor-accessible medium). The machine-readable medium may be any type of magnetic, optical, or electrical storage medium including a diskette, CD-ROM, memory device (volatile or nonvolatile), or similar storage mechanism. The machine-readable medium may contain various sets of instructions, code sequences, configuration information, or other data. Those of ordinary skill in the art will appreciate that other instructions and operations necessary to implement the described invention may also be stored on the machine-readable medium. One embodiment of the invention may be embedded in a hardware product, for example, in a printed circuit board, in a special purpose processor, or in a specifically programmed logic device communicatively coupled to bus 701. Processing unit 702 may be any of a wide variety of general-purpose processors or microprocessors (such as the Pentium® processor family manufactured by Intel® Corporation), a special purpose processor, or a specifically programmed logic device. Processing unit 702 is operable to receive instructions which, when executed by the processing unit cause the processing unit to execute application programs 720.

Display device 705 is coupled to processing unit 702 through bus 701 and provides graphical output for computer system 700. Input devices 706 such as a keyboard or mouse are coupled to bus 701 for communicating information and command selections to processing unit 702. Other input devices may include a microphone, joystick, game pad, scanner, or the like. Also coupled to processing unit 702 through bus 701 is an input/output interface (not shown) which can be used to control and transfer data to electronic devices (printers, other computers, etc.) connected to computer system 700. Computer system 700 includes network devices 708 for connecting computer system 700 to one or more remote devices (e.g., the receiving node) 712 via network 714. Remote device 712 may be another personal computer, a server, a router, a network PC, a wireless device or other common network node and typically includes one or more of the elements described above with respect to computer system 700. Network devices 708, may include a network interface for computer system 700, Ethernet devices, network adapters, phone jacks, modems, and satellite links. It will be apparent to one of ordinary skill in the art that other network devices may also be utilized.

Thus, a method and apparatus to adaptively validate a physical net routing topology of a substrate design. While there has been illustrated and described what are presently considered to be example embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A method to adaptively validate a physical net routing topology of a substrate design to a target topology of the substrate design comprising:
   generating a tree data structure by mapping physical net routing topology objects to tree data structure objects, said tree data structure representing the substrate design;
   comparing the target topology with the tree data structure;
   validating the tree data structure;
   naming one or more branches of the validated tree data structure;
   partitioning the validated tree data structure if the target topology matches the validated tree data structure.

2. The method of claim 1, wherein generating a tree data structure by mapping physical net routing topology objects to tree data structure objects, said tree data structure representing the substrate design comprises:
   converting a vendor's computer aided design (CAD) database to a vendor independent CAD database;
   searching for a starting component pin; and
   using the starting component pin to begin mapping the physical net routing topology objects to tree data structure objects.

3. The method of claim 1, further comprising compressing the tree data structure to form a compressed tree data structure, prior to validating the tree data structure, to generate a compressed data structure.

4. The method of claim 3, wherein compressing the tree data structure to form a compressed tree data structure comprises at least one of:
   removing branches that exist within a pin pad;
   removing test stubs; and
   removing devices that a user decides to remove from the compressed tree data structure.

5. The method of claim 3, wherein validating the tree data structure comprises:
   reading the target topology;
   matching objects of the tree data structure with objects in the target topology;
   determining whether to expand the validated tree data structure; and
   expanding the validated tree data structure in response to an input.

6. The method of claim 5 wherein matching objects of the tree data structure with objects in the target topology comprises:

searching for objects in at least one of parent nodes in the tree data structure and child nodes in the tree data structure.

7. The method of claim 5 wherein expanding the validated tree data structure in response to an input comprises:
    receiving an input to expand the validated tree data structure;
    traversing a discrete component pin in response to the input to search for a new network;
    adding the new network to the compressed tree data structure to form an expanded tree data structure; and
    compressing the expanded tree data structure.

8. The method of claim 1, further comprising saving at least one branch of the validated tree data structure.

9. An article of manufacture to adaptively validate a physical net routing topology of a substrate design to a target topology of the substrate design comprising:
    a machine-accessible medium including instructions that, when executed by a machine, causes the machine to perform operations comprising
        generating a tree data structure by mapping physical net routing topology objects to tree data structure objects, said tree data structure representing the substrate design;
        comparing the target topology with the tree data structure;
        validating the tree data structure;
        naming one or more branches of the validated tree data structure;
        partitioning the validated tree data structure if the target topology matches the validated tree data structure.

10. The article of manufacture of claim 9 wherein said instructions for generating a tree data structure by mapping physical net routing topology objects to tree data structure objects, said tree data structure representing the substrate design comprises further instructions for
    converting a vendor's CAD database to a vendor independent CAD database;
    searching for a staring component pin; and
    using the staring component pin to begin mapping the physical net routing topology objects to tree data structure objects.

11. The article of manufacture of claim 9, further comprising compressing the tree data structure to form a compressed tree data structure, prior to validating the tree data structure, to generate a compressed data structure.

12. The article of manufacture of claim 11, wherein said instructions for compressing the tree data structure to form a compressed tree data structure comprises further instructions for at least one of:
    removing branches that exist within a pin pad;
    removing test stubs; and
    removing devices that a user decides to remove from the compressed tree data structure.

13. The article of manufacture of claim 11, wherein said instructions for validating the tree data structure comprises further instructions for:
    reading the target topology;
    matching objects of the tree data structure with objects in the target topology;
    determining whether to expand the validated tree data structure; and
    expanding the validated tree data structure in response to an input.

14. The article of manufacture of claim 13 wherein said instructions for matching objects of the tree data structure with objects in the target topology comprises further instructions for searching for objects in at least one of parent nodes in the tree data structure and child nodes in the tree data structure.

15. The article of manufacture of claim 13 wherein said instructions for expanding the validated tree data structure in response to an input comprises further instructions for:
    receiving an input to expand the validated tree data structure;
    traversing a discrete component pin in response to the input to search for a new network;
    adding the new network to the compressed tree data structure to form an expanded tree data structure; and
    compressing the expanded tree data structure.

16. The article of manufacture of claim 9, further comprising saving at least one branch of the validated tree data structure.

17. A system for inserting a flip-flop in a circuit design between a driver and a receiver comprising:
    a memory;
    a processor; and
    a bus coupled to the memory and the processor, the processor to perform the following operations,
        generate a tree data structure by mapping physical net routing topology objects to tree data structure objects, said tree data structure representing the substrate design;
        compare the target topology with the compressed tree data structure;
        validate the tree data structure;
        name one or more branches of the validated tree data structure;
        partition the validated tree data structure if the target topology matches the validated tree data structure.

18. The system of claim 17 wherein the processor to generate a tree data structure by mapping physical net routing topology objects to tree data structure objects, said tree data structure representing the substrate design comprises the processor to:
    convert a vendor's CAD database to a vendor independent CAD database;
    search for a starting component pin; and
    use the starting component pin to begin mapping the physical net routing topology objects to three data structure objects.

19. The system of claim 17, wherein the processor is to compress the tree data structure to form a compressed tree data structure.

20. The system of claim 19, wherein the processor is to validate the compressed tree data structure based on the following operations:
    read the target topology;
    match objects of the tree data structure with objects in the target topology;
    determine whether to expand the validated tree data structure; and
    expand the validated tree data structure in response to an input.

21. The system of claim 20 wherein the processor to match objects of the tree data structure with objects in the target topology comprises the processor to:
    search for objects in at least one of parent nodes in the tree data structure and child nodes in the tree data structure.

22. The system of claim 20 wherein the processor to expand the validated tree data structure in response to an input comprises the processor to:

receive an input to expand the validated tree data structure;

traverse a discrete component pin in response to the input to search for a new network;

add the new network to the compressed tree data structure to form an expanded tree data structure; and compress the expanded tree data structure.

23. An apparatus to adaptively validate a physical net routing topology of a substrate design to a target topology of the substrate design comprising:

a tree data structure module to generate a tree data structure by converting a vendors computer aided design (CAD) database to a vendor independent CAD database, and to map physical net routing topology objects to tree data structure objects, said tree data structure representing the substrate design;

a compression module coupled to the tree data structure module to remove at least one of test stubs, branches, and identified devices to form a compressed tree data structure;

a validation module coupled to the compression module to validate the compressed tree data structure;

a dynamic expansion module coupled to the validation module to dynamically expand the validated tree data structure if necessary; and a partitioning module coupled to the dynamic expansion module to partition the validated tree data structure.

24. The apparatus of claim 23 further comprising the dynamic expansion module to expand the validated tree data structure to include a second network on receiving an instruction.

25. The apparatus of claim 23 further comprising the partitioning module to name a branch of the validated tree data structure and to save the named branch.

26. A method comprising:

adaptively validating a physical net routing topology of a substrate design to a target topology of the substrate design, wherein the validating includes, generating a tree data structure by mapping physical net routing topology objects to tree data structure objects, said tree data structure representing the substrate design;

validating the tree data structure based on a comparison with the target topology; and adapting the tree data structure to match the target topology.

27. The method of claim 26, further comprising compressing the tree data structure to form a compressed tree data structure, prior to validating the tree data structure, to generate a compressed data structure.

28. The method of claim 26, further comprising partitioning the validated tree data structure if the target topology matches the validated tree data structure.

* * * * *

UNITED STATES PATENT AND TRADEMARK OFFICE
CERTIFICATE OF CORRECTION

PATENT NO. : 7,111,270 B2 Page 1 of 1
APPLICATION NO. : 10/376052
DATED : September 19, 2006
INVENTOR(S) : Neal et al.

It is certified that error appears in the above-identified patent and that said Letters Patent is hereby corrected as shown below:

In column 9, line 10, in Claim 7, before "tree" delete "compressed".

In column 9, line 20, in Claim 9, after "comprising" insert -- , --.

In column 10, line 11, in Claim 15, before "tree" delete "compressed".

In column 10, line 28, in Claim 17, before "tree" delete "compressed".

In column 10, line 44, in Claim 18, delete "three" and insert -- tree --, therefor.

In column 11, line 12, in Claim 23, delete "vendors" and insert -- vendor's --, therefor.

Signed and Sealed this

Thirteenth Day of January, 2009

JON W. DUDAS
*Director of the United States Patent and Trademark Office*